United States Patent [19]

Beyerle et al.

[11] Patent Number: 5,242,562

[45] Date of Patent: Sep. 7, 1993

[54] METHOD AND APPARATUS FOR FORMING PRINTED CIRCUITS

[75] Inventors: Richard A. Beyerle, Chesterland, Ohio; Robert J. Plascak, Schaumburg, Ill.

[73] Assignee: Gould Inc., Eastlake, Ohio

[21] Appl. No.: 888,788

[22] Filed: May 27, 1992

[51] Int. Cl.⁵ ............................................. C25D 17/00
[52] U.S. Cl. ..................................................... 204/206
[58] Field of Search ........................................ 204/206

[56] References Cited

U.S. PATENT DOCUMENTS

| | | | |
|---|---|---|---|
| 3,475,284 | 10/1969 | Olson | 204/15 |
| 3,482,098 | 12/1969 | Kramer | 204/28 |
| 3,629,077 | 12/1971 | Gannoe | 204/28 |
| 3,634,223 | 1/1972 | Carter | 204/206 |
| 3,729,389 | 4/1973 | DeAngelo et al. | 204/15 |
| 3,819,502 | 6/1974 | Meuldijk et al. | 204/206 |
| 3,855,108 | 12/1974 | Bolz et al. | 204/206 |
| 3,956,077 | 5/1976 | Hamby et al. | 204/15 |
| 4,053,370 | 10/1977 | Yamashita et al. | 204/13 |
| 4,144,118 | 3/1979 | Stahl | 156/659 |
| 4,431,500 | 2/1984 | Messing et al. | 204/206 |
| 4,444,619 | 4/1984 | O'Hara | 156/645 |
| 4,451,345 | 5/1984 | Nemoto et al. | 204/206 |
| 4,487,654 | 12/1984 | Coppin | 156/645 |
| 4,946,563 | 8/1990 | Yeatts | 204/15 |

Primary Examiner—T. M. Tufariello
Attorney, Agent, or Firm—D. Peter Hochberg; Mark Kusner

[57] ABSTRACT

A method and apparatus for continuously forming printed circuits, the apparatus including a cylindrical drum rotatable about a generally vertical axis and a tank for holding an electrolytic plating solution. The tank is dimensioned to surround a lower portion of the drum and immerse the lower portion of the drum in the electrolytic plating solution. Means for introducing electrolytic solution into the tank are provided, and a plurality of metallic anodes are disposed within the tank surrounding and facing the lower portion of the drum defining a generally uniform gap therebetween. A plurality of cathodes are disposed above the tank and facing an upper portion of the drum, the cathodes being biased toward the drum. The apparatus is adapted to receive a movable continuous flexible web having a thin layer of conductive metal on one side thereof. The metal layer is masked to expose a plurality of patterns aligned along the web and a continuous strip of exposed metal along one edge of the web. The web is to be positioned against the drum with the metal layer facing away therefrom and with the exposed patterns extending into the gap and facing the anodes. The continuous strip of exposed metal is above the tank and facing the cathodes wherein the cathodes are biased into electrical contact therewith as the web moves through the apparatus.

17 Claims, 8 Drawing Sheets

METHOD AND APPARATUS FOR FORMING PRINTED CIRCUITS

FIELD OF THE INVENTION

The present invention relates generally to the production of printed circuits by an electrodeposition process, and more particularly to an apparatus and process for automatic, continuous fabrication of printed circuits.

BACKGROUND OF THE INVENTION

Printed circuits are widely used as an inexpensive vehicle for interconnecting various electronic components in an electronic circuit. It is known in the art to produce printed circuits by a so called "build-up" method, wherein an insulating carrier or base material is clad with a relatively thin base layer of copper. A mask or pattern is provided over the base layer of copper to cover all areas not corresponding to the desired pattern of the printed circuit. The unmasked, exposed copper is then "built-up", typically by means of galvanic or electrolytic deposition of copper, and if desired, additional metals such as tin/lead alloys, nickel, brass, gold and the like. Thereafter, the layer of masking material is removed and the original thin layer of previously masked copper, which is now exposed, is removed by an etching treatment. Heretofore, printed circuits produced by the "build-up" method were typically made in batches wherein a limited number of insulation boards were simultaneously masked, built-up and etched in individual deposition tanks and etching tanks.

Efforts have been made to produce printed circuits by automatic, continuous fabrication wherein dry photopolymer material is applied to and masks selected portions of a copper clad, continuous length of flexible polymer strip to form patterns of exposed copper thereon. The copper clad strip is guided over a cathodic electrode roller into a copper plating bath. Portions of the exposed copper contact the electrode roller and couple the cathodic potential thereof to the bath wherein an anode adjacent the strip affects plating of copper from the bath onto the exposed selected portions of the copper.

A problem with such processes is that the current which may be applied to the film, is limited by the cross-sectional area of the base layer of copper thereon. In this respect, it is the layer of copper on the film which conducts current from the cathodic electrode roller to the plating tank. In addition to the cross-sectional area of the copper layer, i.e. the width of the copper layer times (x) its thickness equalling the current carrying cross-sectional area of the metal, the distance from the cathodic electrode rollers to the plating tank also affects the current carrying ability of the copper layer. In this respect, it is well known in the art that the longer the current path, the greater the resistance to current flow, and that heat generated in the foil increases by the square of the current. The damaging effect of heat on copper foil as well as the processing equipment represents a major obstacle to the continuous processing of printed circuits. Thus, the thinner the base foil, the less current which may be applied to the foil.

The present invention overcomes limitations in continuous processing by providing an apparatus which shortens the current flow path between the cathodic electrode and the anode electrode and effectively increases the cross-sectional area of foil to which current may be applied.

SUMMARY OF THE INVENTION

In accordance with the present invention, there is provided an apparatus for continuously forming printed circuits. The apparatus includes a cylindrical drum rotatable about a generally vertical axis, and a tank for holding an electrolytic plating solution. The tank is dimensioned to surround a lower portion of the drum and immerse the lower portion of the drum in the electrolytic solution. Means are provided for introducing electrolytic solution into the tank. A plurality of metallic anodes are disposed within the tank surrounding and facing the lower portion of the drum wherein a generally uniform gap is defined therebetween. A plurality of cathodes are disposed above the tank and facing an upper portion of the drum, the cathodes being biased toward the drum. Means are provided for moving a continuous, flexible film around the drum wherein a portion of the film is disposed within the gap and a portion is above the tank and in contact with said cathodes.

In accordance with another aspect of the present invention, there is also provided a process for manufacturing printed circuits comprising the steps of:

(a) printing a plating resist onto an electronically conductive layer of material on one side of an elongated strip of flexible substrate to leave exposed: 1) one or more patterns of a printed circuit; and 2) a continuous band of the conductive layer along one edge of the substrate;

(b) passing the substrate edgewise through a tank containing an electrolytic plating solution and at least one anode, wherein the patterns on the substrate are disposed within the plating solution and move past the anode, and the continuous band is disposed above the plating solution in electrical contact with a cathode element; and (c) creating an electrical potential across the cathode and the anode as the pattern on the substrate passes by the anode to electroplate the exposed patterns.

It is an object of the present invention to provide a method and apparatus for continuous fabrication of printed circuits.

Another object of the present invention is to provide a method and apparatus for continuous fabrication of printed circuits by an electrodeposition process.

Another object of the present invention is to provide a method and apparatus for continuous fabrication of printed circuits wherein the operating current densities and deposition rate may be increased over processes known heretofore.

Another object of the present invention is to provide an apparatus and process for continuous fabrication of printed circuits wherein the distance between the cathodic electrode and anodic electrode is minimized.

A still further object of the present invention is to provide an apparatus and method for continuous fabrication of printed circuits wherein a plurality of cathodic electrodes engage a moving strip of metallic foil.

A still further object of the present invention is to provide a method and apparatus for continuous fabrication of printed circuits wherein a continuous moving strip of metallic foil passes through an electrolytic solution with the cathodic electrode engaging a length of the strip while such length passes through electrolytic plating solution.

These and other objects and advantages will become apparent from the following description of the preferred embodiment taken together with the accompanying drawings.

BRIEF DESCRIPTION OF THE DRAWINGS

The invention may take physical form in certain parts and arrangement of parts, a preferred embodiment of which will be described in detail in the specification and illustrated in the accompanying drawings which form a part thereof and wherein.

BRIEF DESCRIPTION OF PREFERRED EMBODIMENT

Figure 1A:
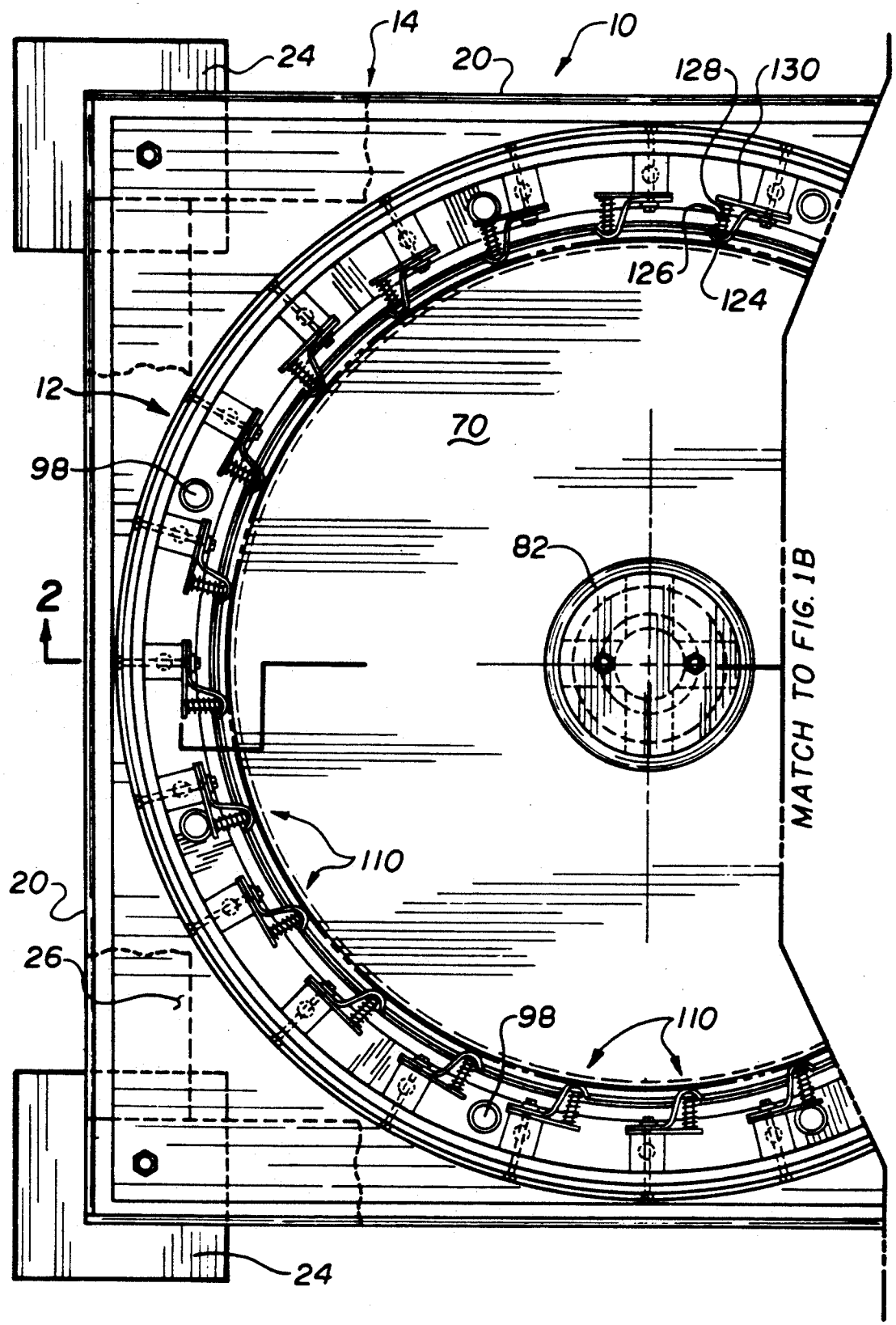
FIGS. 1A and 1B are a top, plan view of a pattern plating apparatus illustrating a preferred embodiment of the present invention.

Referring now to the drawings, an apparatus 10 for plating patterns of printed circuits by an electrodeposition process is shown. Apparatus 10 is adapted to deposit metal on patterns formed on a continuously moving web or film, designated "W" in the drawings. Apparatus 10 is generally comprised of a plating tank assembly 12 which is set upon a support structure 14.

Support structure 14 in and of itself forms no part of the present invention, and is provided merely to elevate tank support assembly 12 above ground level. In the embodiment shown, support structure 14 is basically a rectangular frame 20 formed from structural angle members. Support legs 22 are provided at the corners of frame 20 and extend downward to elevate frame 20. Pads 24 are provided at the lowest ends of legs 22. A rectangular plate 26 is secured to frame 20 and includes a centrally located aperture 28 therethrough.

Tank assembly 12 is generally formed by a cylindrical wall 32 which is generally symmetrical about a vertical axis designated "A" in the drawings. A circular plate 34 is secured to the lower end of wall 32. Plate 34 is dimensioned to rest upon plate 26 of support structure 14 and includes a centrally located aperture 36 in registry with aperture 28 of plate 26. A horizontally disposed inner wall 38 is provided within cylindrical wall 32 and forms an upper chamber 40 and a lower chamber 42. Inner wall 38 is secured to cylindrical wall 32 to be water tight therewith wherein chamber 40 defines a plating chamber to contain electrolytic fluid as will be described in greater detail hereinafter. Inner wall 38 includes a centrally located aperture 44 dimensioned to receive a fluid distributor block 50.

Fluid distributor block 50 is generally cylindrical in shape and includes an upper end 52 and a lower end 54, both being of smaller diameter than the central portion of distributor block 50 and defining therewith annular shoulders 56, 58. Lower end 54 of distributor block 50 is dimensioned to be snugly received within aperture 44 of inner wall 38 with shoulder 58 of distributor block 50 resting upon inner wall 38. Distributor block 50 is secured to inner wall 38 to be water tight therewith.

An axially aligned, generally vertical primary channel 60 extends into distributor block 50 from the bottom thereof. A plurality of horizontally oriented secondary channels 62 extend into distributor block 50 from the sides thereof and intersect primary channel 60. Distributor block 50 is provided to circulate electrolytic fluid from a reservoir (not shown) into chamber 40. To this end, a coupling 64 extends from the lower end of distributor block 50 to receive a fitting 66 which is connectable to a hose or piping (not shown) which in turn is connected to a recirculating pump (not shown). In this respect, apertures 28 and 36 in plates 26, 34 respectively are provided to receive a hose or piping extending from fitting 66. To facilitate connection of a hose or piping to fitting 66, an access opening 68 is formed in cylindrical wall 32. As indicated above, distributor block 50 is connected to a conventional recirculating system including a recirculating pump (not shown), a reservoir (not shown), and a heat exchanger (not shown) to cool and recirculate electrolytic fluid from plating chamber 40.

Referring now to the upper end 52 of distributor block 50, a drum 70 is provided to set thereon and to be rotatable about axis "A". Drum 70 is generally comprised of two spaced apart circular plates 72, 74 secured at their outer edges to a cylindrical hoop or ring 76. Ring 76 has an outward facing cylindrical surface 78 which is symmetrical about axis "A". A cylindrical hub or bushing 80 extends axially through the center of plates 72, 74. Bushing 80 is dimensioned to be received on upper end 52 of distributor block 50 with the lower end of bushing 80 resting upon shoulder 58 of distributor block 50 and to be rotatable thereon. Importantly, drum 70 is dimensioned such that a portion of annular surface 78 is disposed above the upper edge of cylindrical wall 32 which defines the upper lever or limit of plating chamber 40. In other words, drum 70 is positioned on distributor block 50 such that the lower portion thereof is disposed within plating chamber 40 and a portion thereof extends above plating chamber 40. In the embodiment shown, a cap 82 is provided on the upper end of bushing or hub 80.

Figure 2A:
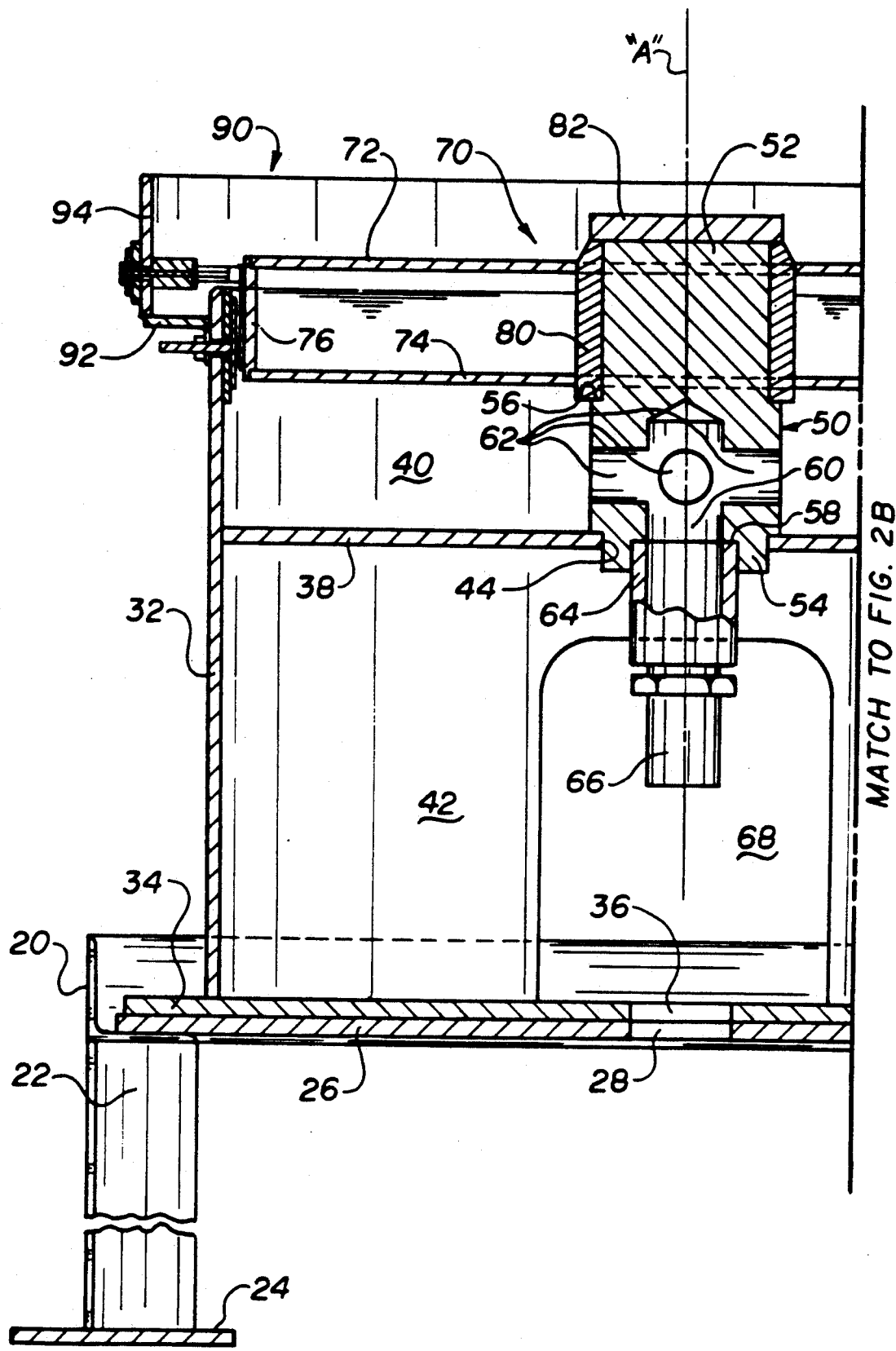
FIGS. 2A and 2B together show a sectional view taken along line 2—2 of FIG. 1.
Figure 2B:
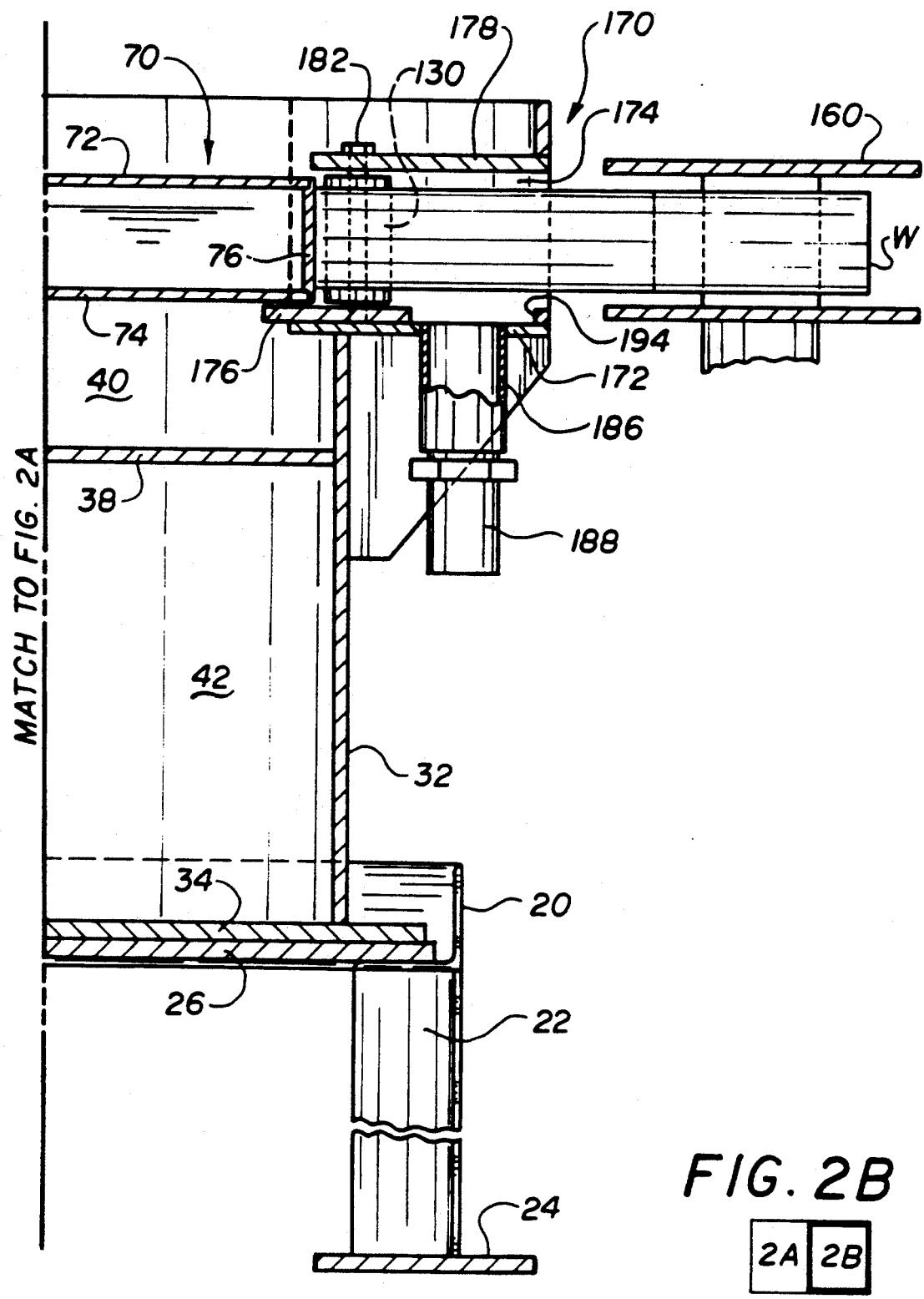
Figure 3:
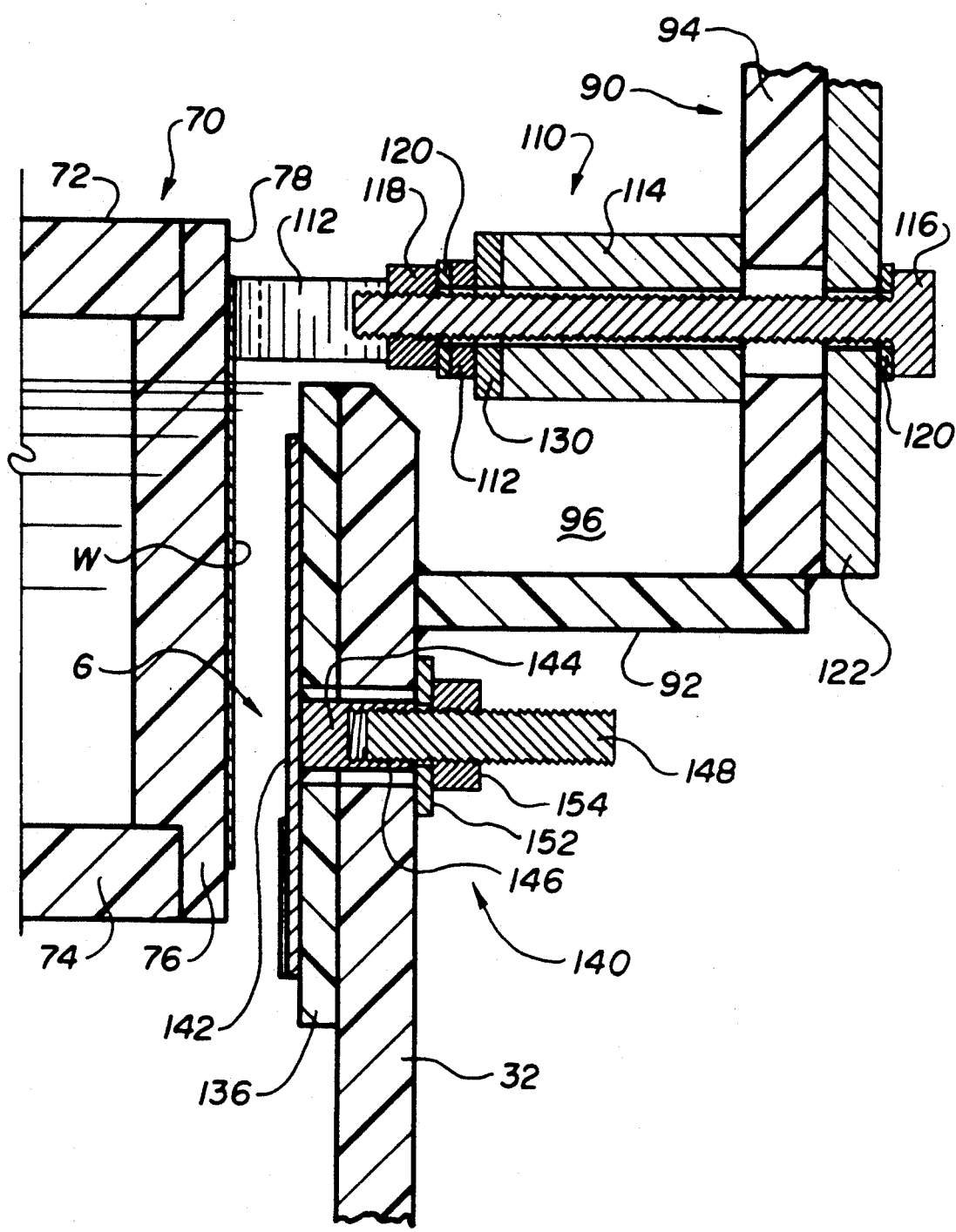
FIG. 3 is an enlarged view of the cathode/anode configuration of the pattern plating apparatus shown in FIG. 1.
Figure 4:
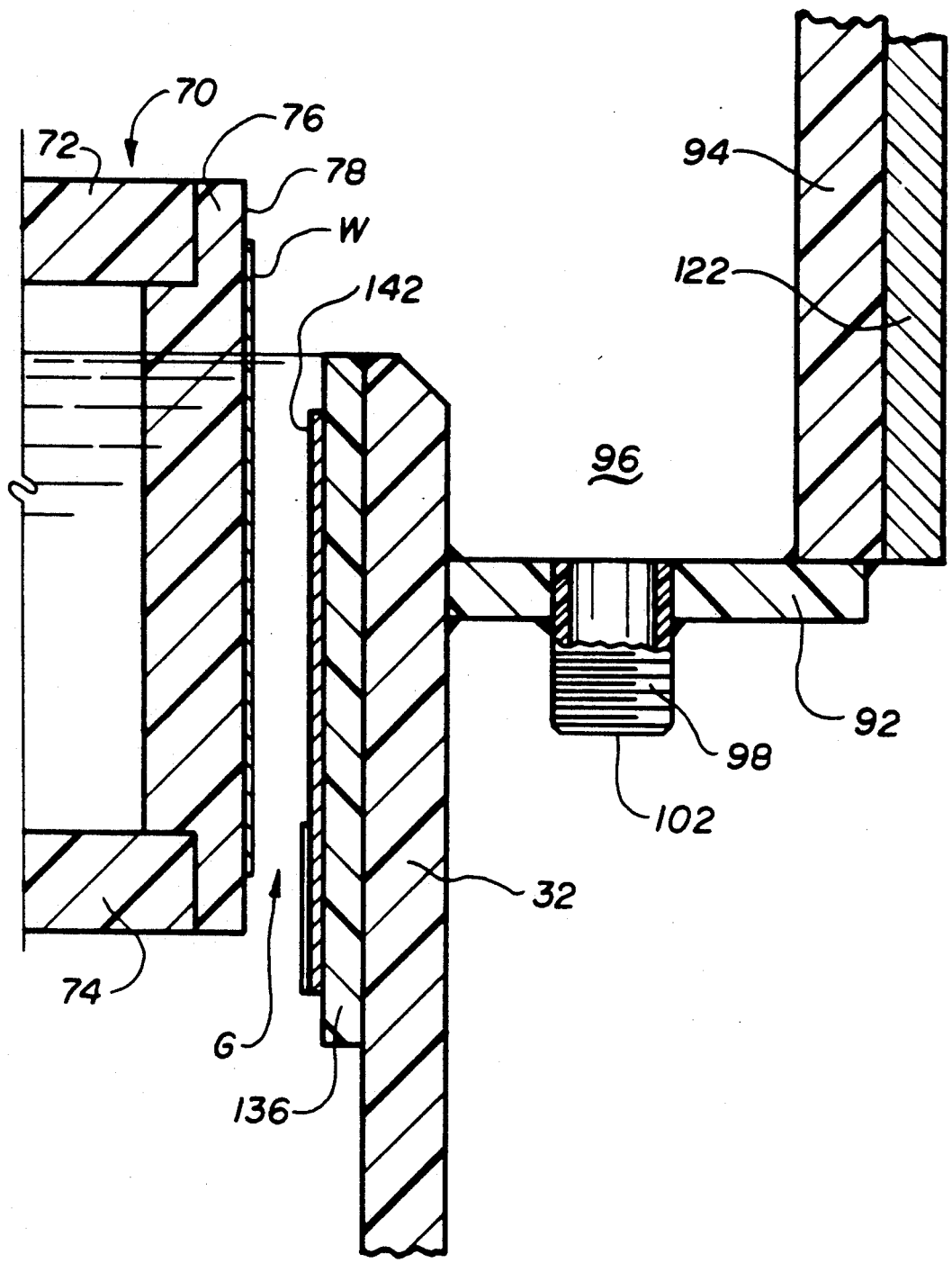
FIG. 4 is an enlarged, elevational view of the electrolytic recovery system of the pattern plating apparatus shown in FIG. 1.

Referring now to FIGS. 2A, 2B, 3 and 4, a weir structure 90 surrounds a major portion of the upper edge of cylindrical wall 32, i.e., about plating chamber 40. Weir assembly 90 is generally comprised of a horizontally oriented annular plate 92 which extends outward from cylindrical wall 32, and a cylindrical ring 94 which is symmetrical about axis "A" and is secured to the outer free end of plate 92. As best seen in FIGS. 3 and 4, plate 92 is disposed below the upper edge of cylindrical wall 32 thereby forming a trough or channel 96. Trough 96 is provided to collect electrolytic fluid overflowing from plating chamber 40. To this end, a plurality of spaced apart drain ports 98 are provided through plate 92 to facilitate drainage of trough 96, as best illustrated in FIG. 4. Ports 98 are generally comprised of a coupling 102 secured to plate 92. Coupling 102 is attachable to a hose or piping (not shown) to direct drained electrolytic fluid to the above-identified reservoir (not shown). To this end, plate 92, ring 94 and coupling 102 are secured together to be water tight.

Figure 1B:
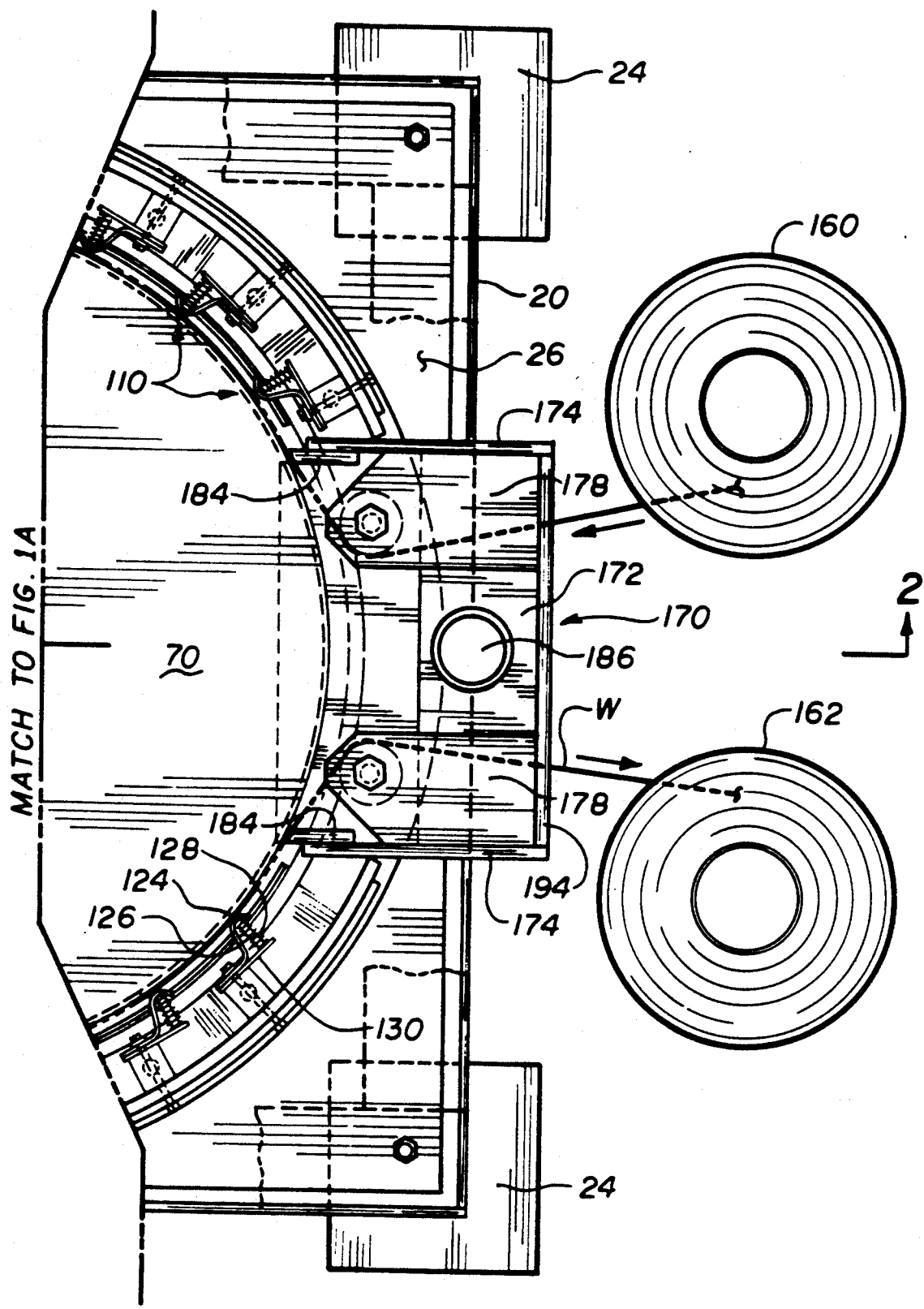

According to the present invention, a plurality of cathode assemblies 110 are disposed about the periphery of drum 70, as best seen in FIGS. 1A and 1B. Each cathode assembly includes a resilient S-shaped conductor shoe 112. One end of conductor shoe 112 is secured to a electrically conductive mounting bar 114 by conventional fastener 116, nut 118 and washer 120. As best seen in FIG. 3, fastener 116 extends through openings in mounting bar 114 and annular ring 94. Fastener 116 likewise extends through a bus plate 122 disposed adjacent the outer surface of ring 94. Bus plate 122 is connectable to a pole of an electrical power source (not shown) in a conventional manner. In the embodiment shown, a single arcuate bus plate 122 extends about ring 94 to connect each cathode assembly 110 to a single power source. As will be appreciated from a further reading of the present specification, a plurality of bus plates 122 may be provided to connect one or more cathode assemblies 110 to separate power sources. As best seen in FIGS. 1A and 1B, S-shaped contact shoes 112 are formed to have a rounded portion 124 facing drum 70. Portion 124 of a contact shoe 112 is biased toward drum 70 by a spring 126 mounted on a pin 128. Pin 128 is secured to a plate 130 which is clamped between conductor shoe 112 and mounting bar 114 by fastener 116. Importantly, as best seen in FIG. 3, S-shaped conductor shoe 112 is disposed adjacent the upper portion of drum 70 and above the upper edge of inner wall 32. In other words, each conductor shoe 112 is disposed above and outside of plating chamber 40.

Anode assemblies 140 are provided within plating chamber 40 about the upper edge of cylindrical wall 32. As shown in FIG. 3, a stiffener 136 is provided along the inner edge of cylindrical wall 32 to provide a mounting location for an anode plate 142. A conductor bar 144 is secured to anode plate 142. Conductor bar 144 is dimensioned to project through openings in cylindrical wall 32 and stiffener 136. An axially aligned threaded bore 146 is formed in the free end of conductor bar 144 to matingly receive a threaded stud 148. Stud 148 is dimensioned to project outward from conductor bar 144 to receive a conventional washer 152 and fastener nut 154. Anode plate 142 is dimensioned to be drawn into water tight engagement with stiffener plate 136. In this respect, an intermediate layer of a resilient compressible, non-conductive material (not shown) such as neoprene or rubber may be provided between anode plate 142 and stiffener plate 136 to form a water tight seal therebetween. For ease of fabrication, apparatus 10 preferably includes a plurality of separate anode assemblies 140 each connectable to an electrical power source rather than a single continuous anode extending about the periphery of cylindrical wall 32. As best seen in FIG. 3, a generally uniform gap "G" is formed between anode plate 142 and surface 78 of drum 70.

Referring now to FIGS. 1B and 2B, apparatus 10 is adapted to receive a continuously moving film or web "W" moving on drum 70 wherein the upper portion of web "W" is in electrical contact with S-shaped cathode conductor shoes 112 and the lower portion of web "W" is disposed within plating chamber 40 adjacent anode plates 142. Web "W" is preferably provided on a first spool 160 from which it may be unwound and wrapped around drum 70 and then taken up by a second spool 162. Spool 162 is preferably motorized by means (not shown) to pull web "W" around drum 70. Alternatively, both spools 160 and 162 could be commonly driven to move at the same speed to avoid stretching or teasing web "W". Drum 70 rotates on distributor block 50 by the motion of film or web "W" being pulled through plating chamber 40 by take up spool 162. Web "W" is preferably under tension to force it into surface contact with drum 70 wherein the frictional engagement between web "W" and outward facing cylindrical surface 78 of drum 70 causes drum 70 to rotate about axis "A" on upper end 52 of distributor block 50. To facilitate movement of web "W" into and out of plating chamber 40, which is adapted to hold an electrolytic plating solution without substantial loss of the solution from chamber 40, a dam assembly 170 is provided on one side of tank assembly 12. Dam assembly 170 is generally comprised of a frame structure having a horizontally oriented bottom wall 172 and vertical side walls 174. Cylindrical wall 32 is notched in the area of dam assembly 170 to enable bottom wall 172 to extend into plating chamber 40 and to be disposed below lower plate 74 of drum 70, as best seen in FIG. 2B. A mounting plate 176 is secured to the inner edge of bottom wall 172 and gusset plates 178 extend inwardly from the side walls 174. Mounting plate 176 is preferably disposed in close proximity to lower plate 74 of drum 70 (as best seen in FIG. 2B) to minimize the gap formed therebetween. A pair of guide rollers 180 are mounted on axles 182 which extend between mounting plate 176 and gusset plates 178. Guide rollers 180 are operable to position and align web "W" relative to drum 70. Because the level of the electrolytic plating solution in plating chamber 40 is intended to cover the lower portion of drum 70, it would normally be above the bottom wall 172 of dam assembly 170. To reduce the flow of electrolytic fluid from chamber 40, vertical sidewalls 174 are preferably formed to create a water tight seal with plate 92 and ring 94 of weir assembly 90. In this respect, vertical sidewalls 174 of dam assembly 170 basically form a dam or barrier across trough 96 formed by weir assembly 90. In this respect, wipers 184 formed of a resilient, pliable material are provided along the edges of vertical walls 172 and press web "W" against drum 70 to form a seal therewith to reduce the flow of electrolytic fluid past vertical wall 172. To collect any fluid which may flow by wipers 184 or under drum 70, a drain 186 is formed in bottom wall 172. Drain 186 is generally comprised of a coupling 188 having a fitting 192 on the end thereof. Fitting 192 is connectable to a hose or piping to conduct plating solution to a reservoir in the recirculating system as previously discussed. A lip 194 is formed along the free end of bottom wall 172 to form a basin 196 to collect plating solution and channel same into drain 186.

The major structural components of apparatus 10 as heretofore described, such as support structure 14, tank assembly 12 and drum 70, are preferably formed of a plastic, non-conductive and acid resistant material, such as polyethylene or polypropylene. Cathode conductor shoe 112, mounting bars 114 and bus plate 122 are preferably formed of copper with fastener components 116, 118 and 120 being stainless steel. Anode plate 142 may be formed of titanium and include a platinum coating on the exposed side thereof with conductor bar 144 being copper and stud 148, washer 152 and nut 154 being stainless steel.

Figure 5:
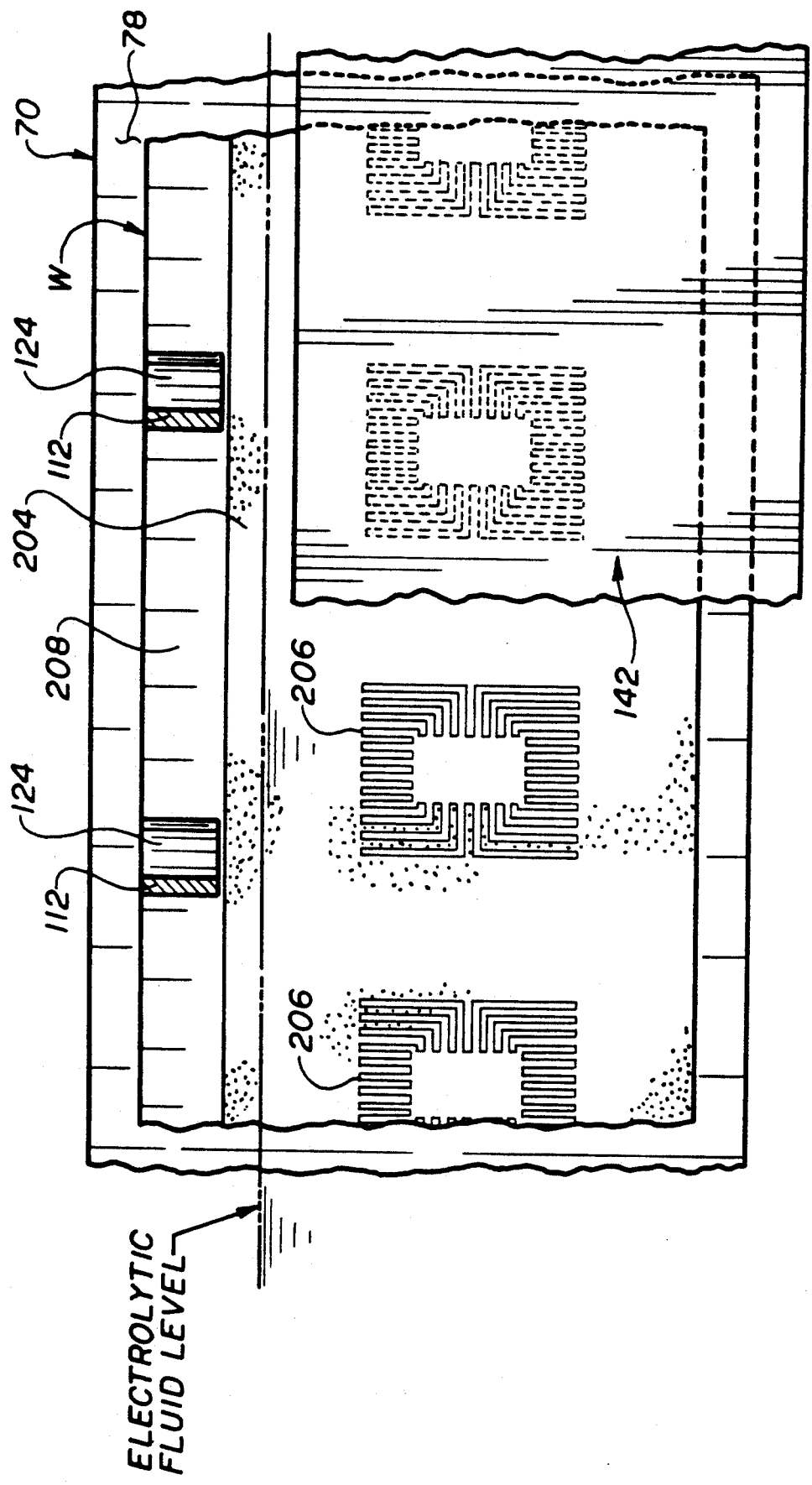
FIG. 5 is a side elevational view illustrating a moving web having circuit patterns masked thereon for build-up in the apparatus shown in FIG. 1.

As indicated above, apparatus 10 is adapted to plate printed circuit patterns provided on a web "W". According to the present invention, web "W" shown in FIG. 5 is preferably a thin, flexible strip or film 200 of a non-conductive material which is clad on one side thereof with a thin layer 202 of metal. The metal clad side of film 200 is masked with a masking material 204, by conventionally known techniques, to define patterns 206. Patterns 206 are defined by exposed, unmasked areas of the base metal layer 202. A plurality of patterns 206 are preferably aligned side-by-side longitudinally along web "W", which patterns 206 are positioned generally along one edge thereof. The other edge of web "W" is left unmasked to define a band 208 of exposed, unmasked base metal layer 202. It is believed that strip 200 may be formed of any flexible, non-conductive material and that layer 200 may be any plateable metal. A plastic film of a few mills thickness having 17 angstroms (Å) applied thereon has provided satisfactory results in plating patterns according to the present invention. In this respect, as indicated above, the base copper is masked to define patterns to be plated and defines a continuous band 208 of base copper extending along one edge of web "W".

Referring now more specifically to the operation of the present invention, plating chamber 40 is dimensioned to contain an electrolytic plating solution containing metal ions to be plated onto patterns 206 on web "W". The concentration of metal ions within the electrolytic plating solution is maintained at a desired level by a recirculating system. Such systems are conventionally known and would include a pump to force electrolytic plating solution into plating chamber 40 through distributor block 50. The electrolytic plating solution within plating chamber 40 is forced upward through gap "G" between anode plates 142 and drum 70. In this area, metal ions within the electrolytic plating solution are plated onto patterns 206 by electrodeposition, as will be discussed in greater detail below. The electrolytic solution within gap "G" is continuously flowing upward as a result of solution being pumped into plating chamber 40 through distributor block 50. As a result, ion depleted electrolytic solution is forced upward through gap "G" until it overflows the upper edge of cylindrical wall 32, wherein it is collected in trough 96 formed by weir assembly 90. The collected solution flows through drain ports 98 of weir assembly 90 and returns to a reservoir (not shown) wherein the metallic ion concentration of the solution may be replenished. The ion replenished electrolytic plating solution is then once again pumped back into plating chamber 40 to continuously supply metal ions thereto. In addition, a recirculating system would typically include a heat exchanger to dissipate the substantial heat generated in an electrodeposition process. In this respect, systems for recirculating and replenishing ions in electrolytic plating solution are conventionally known, the foregoing description being provided to assist in understanding the operation of the present invention.

According to the present invention, apparatus 10 is designed to move web "W" oriented on its edge through plating chamber 40. In this respect, a web "W" as previously described is preferably provided on spool 160, wherein web "W" is unwound and rotated onto drum 70 as illustrated in FIGS. 1A and 1B. Web "W" is oriented within apparatus 10 such that the masked metal surface of web "W" faces outward from drum 70. Importantly, web "W" is positioned against drum 70 such that the lower portion thereof disposed within plating chamber 40, and that band 208 of unmasked base metal 202 is disposed above and out of plating chamber 40 and in electrical contact with conductor shoes 112 of cathode assemblies 110. More specifically, the lower portion of web "W", having masked patterns 206 thereon, is disposed within plating chamber 40 opposite anode plates 142. Web "W" is preferably drawn or pulled through plating chamber 40 by take-up spool 162. Drum 170 rotates on distribution block 50 as web "W" is pulled through plating chamber 40. As web "W" moves through plating chamber 40, a positive electrical charge is applied to anode plates 142 and a negative electrical charge is applied to cathode conductor shoes 112. The negative charge applied to the cathode assemblies is conducted through conductor shoe 112 to base metal layer 202 of web "W" as a result of the electrical contact of conductor shoes 112 with band 208 of exposed base metal 202. In this respect, the only portion of the base metal 202 exposed to the electrolytic plating solution is the exposed, unmasked metal of pattern 206. The exposed, unmasked metal of pattern 206 is thus negatively charged and opposite positively charged anode plates 142. Copper ions in the electrolytic plating solution thus "plate out" onto the exposed metal surface of patterns 206 and buildup same by electrodeposition. As indicated above, the electrolytic plating solution is continuously pumped past web "W" through plating gap "G" to provide sufficient copper ions to plate onto pattern 206.

Figure 6A:
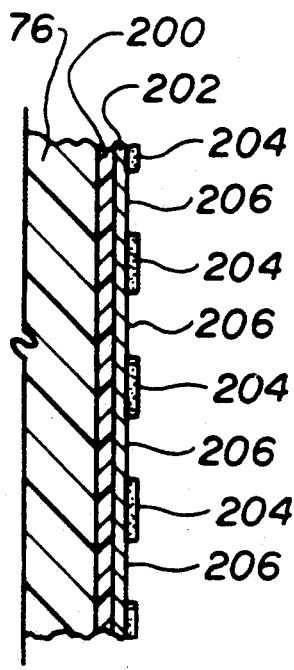
FIGS. 6A, 6B, 6C and 6D are enlarged, sectional view of a web schematically illustrating a plating process according to the present invention.
Figure 6B:
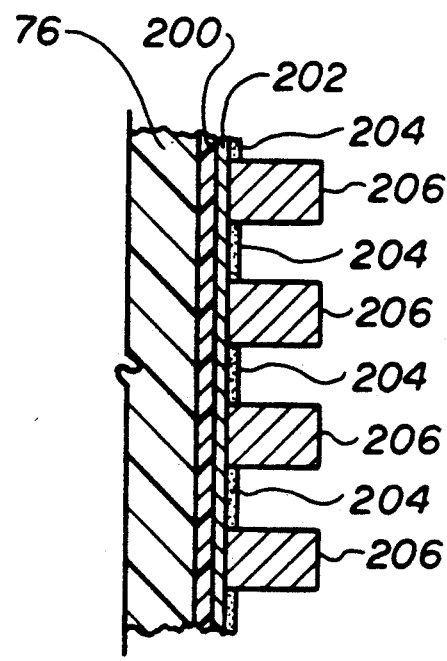
Figure 6C:
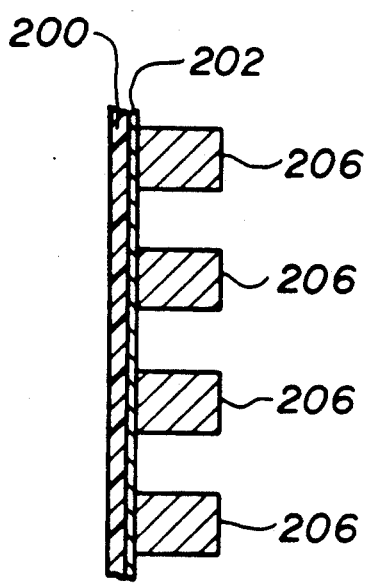
Figure 6D:
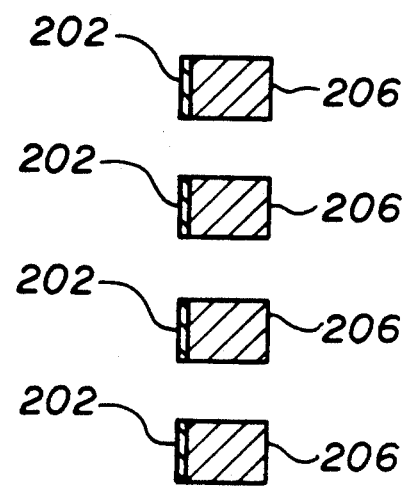

FIGS. 6A, 6B, 6C and 6D show sectional views through film 200 illustrating various stages in the process for forming printed circuit patterns 206 according to the present invention. FIG. 6A shows base film 200 which is approximately a few millimeter thick, having layer 202 of copper thereon. Portions of the base layer 202 of copper are masked with masking material 204 to expose a desired circuit pattern 206. As web "W" is drawn through plating chamber 40, copper is plated onto the exposed, unmasked base copper of patterns 206 to buildup the pattern as best seen in FIG. 6B. After pattern 200 has been built-up, masking material 204 is removed by conventionally known methods to expose the built up copper pattern extending from the base metal layer, as shown in FIG. 6C. The base layer 202 is then removed by an etching process leaving the desired pattern 206 of built up copper which may be removed from film 200, as shown in FIG. 6D.

As will be appreciated, the buildup of copper onto patterns 206 is primarily a function of the voltage applied across the plating gap. While the concentration of copper ions in solution, as well as the duration of time web "W" remains within plating chamber 40 will affect build up of pattern 206, a major factor in an electrodeposition process is the current density at the plating surface. The greater the current density, the faster the plating and the less time required to plate to a desired thickness.

With the present invention, the current density at the plating surface may be increased as compared to processes wherein the film is charged by cathodic roller assemblies. The present invention facilitates plating of patterns 206 by increasing the current which may be applied to the base layer 202 of metal on film 200. Electroplate charging the upper edge of film 200 as it passes through plating chamber 40 increases the current which may be applied to the base layer 200 of metal, as compared to conventional processes known heretofore. In this respect, more conventional plating processes typically pass a film over a cathodic roller disposed above a plating tank. Electrocurrent is conducted through the copper layer onto film lengthwise, i.e., from the cathodic roller longitudinally through the metal layer on the film into the plating tank, etc. The present invention, on the other hand, electrically charges the metal layer along the edge of the filmstrip, wherein the current moves from one edge of the film to the other edge and therefore is not limited by the width of the film. For example, in the embodiment shown, web "W" is approximately 2¾" wide, several mills thick, having a 17 angstrom layer of copper thereon. In a conventionally-known, roller charged plating system, the cathodic roller(s) would be located above the plating tank. The strip or web of material to be plated would pass over such a charging roller and then under and around a drum in the plating tank, adjacent which would be located a charged anode. An electrically potential would thus be created in the strip lengthwise along the longitudinal axis thereof between the cathode roller above the tank and the anode in the tank, and the conductive cross-sectional area through which the electric charge would pass would be the lengthwise cross-sectional area of the strip. In the embodiment discussed above, the cross-sectional area of the strip would be defined by 2¼" (the width of the copper layer) by 17 angstroms (the thickness of the copper layer), which is equal to approximately $1.8 \times 10^{-7}$ square inches. Thus, the current which may be applied to the copper layer would be the current which could be carried by this cross-sectional area. Referring now the present invention, with a drum approximately 24" in diameter, and cathode connector shoes 112 engaging band 208 of metal layer 202 over 80% of the surface of drum 70, the cross-sectional area into which electrical current is passed is equal to the length of foil contacted by cathode conductor shoes 112, i.e., 80% of the circumference of drum 70, times 17 angstroms which is approximately $4.2 \times 10^{-6}$ square inches. In other words with the present invention, current flows width-wise through the copper layer, i.e., from one edge of the film to the other. Thus, the cross-sectional area through which current may be applied is over twenty (20) times the conductive area of processes as described above which charges the foil lengthwise.

Thus, by electrically charging the copper strip along its edge wherein the current flow across the width of the strip, substantially higher amounts of current may be applied to the foil without damaging same. By providing increased current to the foil, higher current densities may be created at the plating gap which thereby increase the rate of plating of metal thereon. More importantly, with the present invention, the distance from the charging cathode to the plating surface is reduced, being approximately the width of the web. The shortened current path likewise reduces heat generated in the foil, it being understood that voltage drop across a length of material is equal to the characteristics of the material as well as the length thereof. By applying current to the edge of the foil, heat generated in the foil is reduced thereby enabling even higher electrical charges to be applied thereto.

As indicated above, in the embodiment shown, drum 70 is approximately 24" in diameter and web "W" is a plastic film approximately 2.75" wide, several mills thick, and has a base layer of copper thereon which is approximately 17 angstroms (Å) thick. As shown in the drawings, twenty (20) cathode conductor shoes 12 are disposed about the periphery of drum 70. In the present embodiment, ten (10) anode plates having a total area of approximately 0.783 square feet are provided within plating chamber 40. In this respect, in the embodiment shown, apparatus 10 is adapted for continuous plating of patterns 206 on web "W". It will, of course, be appreciated, that the present invention may be modified so as to establish complimentary groups of anodes and cathodes wherein each group may be electrically charged at different levels to affect different platings on pattern 206. In this respect, web "W" having patterns 206 thereon may be configured to group a predetermined number of patterns into a block which is electrically isolated from preceding and succeeding blocks of patterns. This may be accomplished by interrupting continuous band 208 with masking material wherein each block of patterns 206 may be electrically isolated from an adjacent block wherein different plating parameters may be applied to a given block depending upon its position among the groups of anodes and cathodes within plating chamber 40.

The present invention thus provides an apparatus and method for continuously forming printed circuit patterns. By charging the base layer along the upper edge of web "W" as compared to what would be considered end-wise charging typically found in more conventional plating arrangements having cathode electrode rollers, the present invention substantially increases the current density which may be applied to the foil and thus substantially increases platings of patterns as they pass through plating tank 40. While the present invention has been described with respect to a preferred embodiment, modifications and alterations will occur to others upon a reading and understanding of the present specification. It is intended that all such modifications and alterations to the present invention be included insofar as they come within the scope of the patent as claimed or the equivalents thereof.

Thus, having described the invention, the following is claimed:

1. An apparatus for continuously forming printed circuits comprising:
   a cylindrical drum rotatable about a generally vertical axis,
   a tank for holding an electrolytic plating solution, said tank dimensioned to surround a lower portion of said drum and immerse said lower portion of said drum in said electrolytic plating solution,
   means for introducing electrolytic solution into tank,
   a plurality of metallic anodes disposed within said electrolytic solution surrounding and facing said lower portion of said drum defining a generally uniform gap therebetween,
   a plurality of cathodes disposed external to said electrolytic solution and facing an upper portion of said drum, said cathodes being biased toward said drum, and
   means for moving a continuous, flexible film around said drum wherein a portion of said film is disposed within said gap and a portion is above said tank and in contact with said cathodes.

2. An apparatus as defined in claim 1 wherein said film has a metal clad layer on one side thereof which is masked along one edge to form a band of longitudinally aligned patterns and unmasked along the other edge to form a band of exposed metal wherein said patterns are disposed within said gap facing said anodes and said band of exposed metal is in conductive contact with said cathodes as said film moves around said drum.

3. An apparatus as defined in claim 1 wherein said tank is generally cylindrical in shape and said anodes are disposed along the inner edge of said tank and form a generally uniform gap with said drum.

4. An apparatus as defined in claim 3 wherein said tank is formed of a non-conductive plastic material and said anodes are mounted to said tank in water-tight fashion and include a conductor portion extending through said tank for connection to an electrical power source.

5. An apparatus as defined in claim 1 wherein said cathodes are comprised of a generally flexible copper stripe which is spring biased toward said drum.

6. An apparatus as defined in claim 5 wherein the biasing force exerted by said springs on said flexible copper strip is adjustable.

7. An apparatus as defined in claim 1 further comprising a weir assembly surrounding the upper portion of said tank to collect plating solution overflowing said tank.

8. An apparatus as defined in claim 2 wherein said metal clad layer is copper and said patterns are printed circuits.

9. An apparatus for continuously forming printed circuits comprising:
 a cylindrical drum rotatable about a generally vertical axis,
 a tank for holding an electrolytic plating solution, said tank dimensioned to surround a lower portion of said drum and immerse said lower portion of said drum in said electrolytic solution,
 means for introducing electrolytic solution into tank,
 a plurality of metallic anodes disposed within said electrolytic solution surrounding and facing said lower portion of said drum defining a generally uniform gap therebetween,
 a plurality of cathodes disposed above said electrolytic solution and facing an upper portion of said drum above said tank, said cathodes being biased toward said drum, and
 said apparatus adapted to receive a movable continuous flexible ribbon having a thin layer of conductive metal on one side thereof, said metal layer being masked to expose a plurality of patters aligned along said ribbon and a continuous strip of exposed metal along one edge of said ribbon, said ribbon to be positioned against said drum with said metal layer facing away therefrom and with said exposed patters extending into said gap and facing said anodes and said continuous strip of exposed metal being above said tank and facing said cathodes wherein said cathodes are biased into electrical contact therewith as said ribbon moves through said apparatus.

10. An apparatus as defined in claim 9 wherein said ribbon is a plastic film and said metal layer is copper.

11. An apparatus as defined in claim 10 wherein said film has a thickness of several mills and said copper is approximately 17 angstroms (Å) thick.

12. An apparatus as defined in claim 9 wherein said ribbon is pulled around said drum through said tank.

13. An apparatus for continuously forming printed circuits comprising:
 a tank for holding an electrolytic plating solution,
 guide means contained within said tank designed to direct a continuous, flexible film on edge through said electrolytic plating solution wherein a lower portion of said film is disposed within said electrolytic plating solution and an upper portion is above said electrolytic plating solution,
 a plurality of metallic anodes disposed within said tank and positioned to be adjacent said continuous flexible film as said film moves through said tank, and
 a plurality of cathodes disposed external to said electrolytic solution and positioned to engage said continuous flexible film as said film moves through said tank.

14. An apparatus as defined in claim 13 wherein said film has a metal clad layer on one side thereof which is masked along one edge to form a band of longitudinally aligned patterns and unmasked along the other edge to form a band of exposed metal wherein said patterns are disposed within said gap facing said anodes and said band of exposed metal is in conductive contact with said cathodes as said film moves around said drum.

15. An apparatus as defined in claim 13 wherein said guide means comprised of a cylindrical drum rotatable about a generally vertical axis.

16. An apparatus as defined in claim 15 wherein said anodes disposed in said tank surround and face said lower portion of said drum defining a generally uniform gap therebetween.

17. An apparatus as defined in claim 14 wherein said film has a continuous metal clad layer on one side thereof.

* * * * *